United States Patent

Itoh

[11] Patent Number: 5,920,397
[45] Date of Patent: Jul. 6, 1999

[54] ELECTRONIC PART INSTALLATION APPARATUS AND METHOD THEREOF

[75] Inventor: Hiroshi Itoh, Hamamatsu, Japan

[73] Assignee: Tenryu Technics Co., Ltd., Hamamatsu, Japan

[21] Appl. No.: 08/752,182

[22] Filed: Nov. 18, 1996

[30] Foreign Application Priority Data

May 14, 1996 [JP] Japan .................................. 8-118754

[51] Int. Cl.$^6$ ...................................................... G01B 11/00
[52] U.S. Cl. ............................................................ 356/400
[58] Field of Search ................................... 356/375, 376,
356/400, 138, 394, 398, 150, 237, 399;
250/59.33–559.39; 348/87, 94, 125; 29/720,
721, 729, 740, 759, 703; 901/47

[56] References Cited

U.S. PATENT DOCUMENTS 4,608,494   8/1986   Kobayaski et al. ......................... 29/721
4,831,549   5/1989   Red et al. .

FOREIGN PATENT DOCUMENTS 5-37191    2/1993   Japan .
5-299890   11/1993  Japan .

*Primary Examiner*—K Hantis
*Attorney, Agent, or Firm*—Kanesaka & Takeuchi

[57] ABSTRACT

An adjustment device of the invention is used for an electronic part installation apparatus having a head portion for holding an electronic part and a moving device for moving the head portion from a supply section to an assembly section. The adjustment device is formed of a base member moving under the head portion, a detecting device for detecting the electronic part held by the head portion, and a control device electrically connected to the detecting device. The detecting device is fixed to the base member and moved under the electronic part while the electronic part is moving from the supply section to the assembly section. During the movement, the electronic part and a position of the electronic part relative to the head portion are recognized. The control device has a memory to which ideal data for the electronic part and the position of the electronic part relative to the head portion are inputted in advance. The control device compares the ideal data inputted in advance to the memory and data received from the detecting device and controls the moving device to properly install the electronic part at the assembly section.

11 Claims, 6 Drawing Sheets

ELECTRONIC PART INSTALLATION APPARATUS AND METHOD THEREOF

BACKGROUND OF THE INVENTION AND RELATED ART STATEMENT

The present invention relates to an electronic part installation apparatus used in assembling or installing electronic parts, and method thereof.

When electronic parts, such as IC chips and so on, are assembled together or installed on a printed board, if an electronic part is not held by an installation head of an assembly device in correct posture and position, the electronic part can not be positioned correctly on the printed board when it is installed. Thus, the printed board with the electronic part will become a malfunctioning or false product.

Therefore, whenever an electronic part is absorbed or sucked by an installation head, the electronic part is inspected by a confirmation or checking camera and so on before it is installed. If data obtained through the confirmation camera are different from the data inputted already in a computer, e.g. holding position of the part by the installation head is wrong, the installation head is actuated to move the electronic part to adjust the position to thereby satisfy the requirement. For example, these techniques are disclosed in Japanese Patent Publications (KOKAI) No. 5-37191 and No. 5-299890.

In the former technique, an electronic part received by a head from a part supply section is recognized or confirmed by a part confirmation camera attached to a main body through a shaft and situated near the part supply device. When used, the camera is moved to a position between a part receiving position and a part installing position, and the head holding the electronic part stops in one position to be recognized by the camera. Thereafter, when the part is installed, the head is moved to adjust the position.

Therefore, the head must be stopped in front of the part confirmation camera, wait for a time that the camera operates, and move to an assembly section. Since these operations are repeated for each installation, there requires a huge time where the electronic parts are not actually installed. In this field, mass processing and high speed installation are required, but the conventional technique can not satisfy the demands.

In the later technique, the confirmation camera is attached to the head, but a mirror box having a mirror therein must be laterally moved alternately between the camera and a part illuminating section for obtaining an light image of the part. In addition, the head must be moved up and down according to the movement of the mirror box.

Accordingly, the structure and movement of the camera and installation device are complicated, and fast and smooth operation to recognize the part can not be made. Thus, it does not contribute to the productivity of the parts assembly.

Also, the apparatus becomes huge, and in a head section, since parts are frequently moved in two directions, e.g. X and Y directions, a plurality of installation heads can not be formed in one head section. Therefore, it is difficult to improve an operation efficiency and installation ability of the parts.

The conventional apparatus has the above problems.

The present invention has been made to solve the above problems, and an object of the invention is to provide an adjustment device for an electronic part installation apparatus and a method of installing electronic parts, in which installation time of the electronic parts can be minimized.

Another object of the invention is to provide an adjustment device for an electronic part installation apparatus and a method of installing electronic parts, in which the electronic parts can be recognized while the electronic parts are being installed by an assembly device.

A further object of the invention is to provide an adjustment device for an electronic part installation apparatus and a method of installing electronic parts, in which a position of the electronic part can be adjusted while the part is being installed.

Further objects and advantages of the invention will be apparent from the following description of the invention.

SUMMARY OF THE INVENTION

An adjustment device of the invention is used for an electronic part installation apparatus. The installation apparatus includes a head portion for holding an electronic part, and moving means for moving the head portion with the electronic part from a supply section to an assembly section.

The adjustment device is formed of a base member attached to the head portion or the moving means and arranged to be movable under the head portion, detecting means for detecting the electronic part held by the head portion, and control means electrically connected to the detecting means. The detecting means is fixed to the base member, and is moved under the electronic part while the electronic part is moving from the supply section to the assembly section. The electronic part and a position of the electronic part relative to the head portion are recognized by the detecting means when the detecting means passes under the electronic part.

The control means has a memory to which ideal data for the electronic part and the position of the electronic part relative to the head portion are inputted in advance. The control means compares the ideal data inputted in advance to the memory and data received from the detecting means, and controls the moving means to properly install the electronic part at the assembly section. Namely, the movement of the head portion is adjusted by the moving means when the electronic part is actually installed.

The detecting means is formed of a light reflecting device situated on the base member, a visual sensor situated on one side of the base member to receive an image of the electronic part and a part of the head portion through the light reflecting device, and a light source situated on the base member coaxially between the light reflecting device and the visual sensor. The light reflecting device passes under the electronic part when the base member moves under the head portion. At the time of passing under the electronic part, the visual sensor takes the necessary data, i.e. image.

The head portion may include a plurality of attaching members and rotating members fixed to the respective attaching members for changing the positions of the attaching members. Each attaching member holds one electronic part to thereby carry a plurality of electronic parts at one movement of the head portion. The memory of the detecting means receives ideal data for each electronic part so that when each electronic part is discharged at the assembly section, moving means is moved to a proper position with reference to the data for each electronic part.

In the method of the invention, when an electronic part is checked in assembling the same, the electronic part is picked up at a supply section by a head portion, which is moved to an assembly section by moving means. While the electronic part is moving from the supply section to the assembly section, detecting means is moved under or over the electronic part held by the head portion to thereby recognize the electronic part and a position of the electronic part relative to the head portion. The data received from the detecting means are compared with ideal data memorized in a memory in advance. The ideal data in the memory includes the electronic part and the position of the electronic part relative to the head portion. Difference between the data from the detecting means and the ideal data in the memory is calculated, and the moving means is actuated with reference to the difference of the data to properly locate the electronic part at the assembly section.

In the invention, while the electronic part is moving from the supply section to the assembly section, the electronic part is checked if it is correct, if it is properly held and so on, by comparing the ideal data in the memory. If the location is not proper, when the electronic part is actually installed, the location of the head portion is adjusted. Thus, the electronic part can be properly adjusted, and the time for checking the electronic part can be saved.

BRIEF DESCRIPTION OF THE DRAWINGS

FIGS. 8 (a) and (b) is an explanatory view for showing an example of adjusting installation used in the apparatus shown in FIG. 4.

DETAILED DESCRIPTION OF PREFERRED EMBODIMENTS

With reference to the drawings, embodiments of an adjustment device for an electronic part installation apparatus and a method of installing electronic parts of the invention have been explained.

In FIGS. 1, 2, 4 and 7, A is an installation adjusting device in an electronic part assembly apparatus W, which receives electronic parts b, such as chips, IC parts and so on, from a supply section m and transfers to an assembly section to thereby install the electronic parts onto predetermined positions on a print board c. The installation adjusting device A is basically formed of an attachment or a base member 1, a detection device 2 and a control device 3.

In the electronic part assembly apparatus W, the supply section m for the electronic parts b is formed at one side of a machine body 4. In the supply section m, the parts b are supplied through a part feeder and stored therein for usage. Also, an assembly section n is formed in the machine body 4, wherein parts, e.g. print board, to be assembled with the parts b are transferred by a transfer member (not shown).

Figure 1:
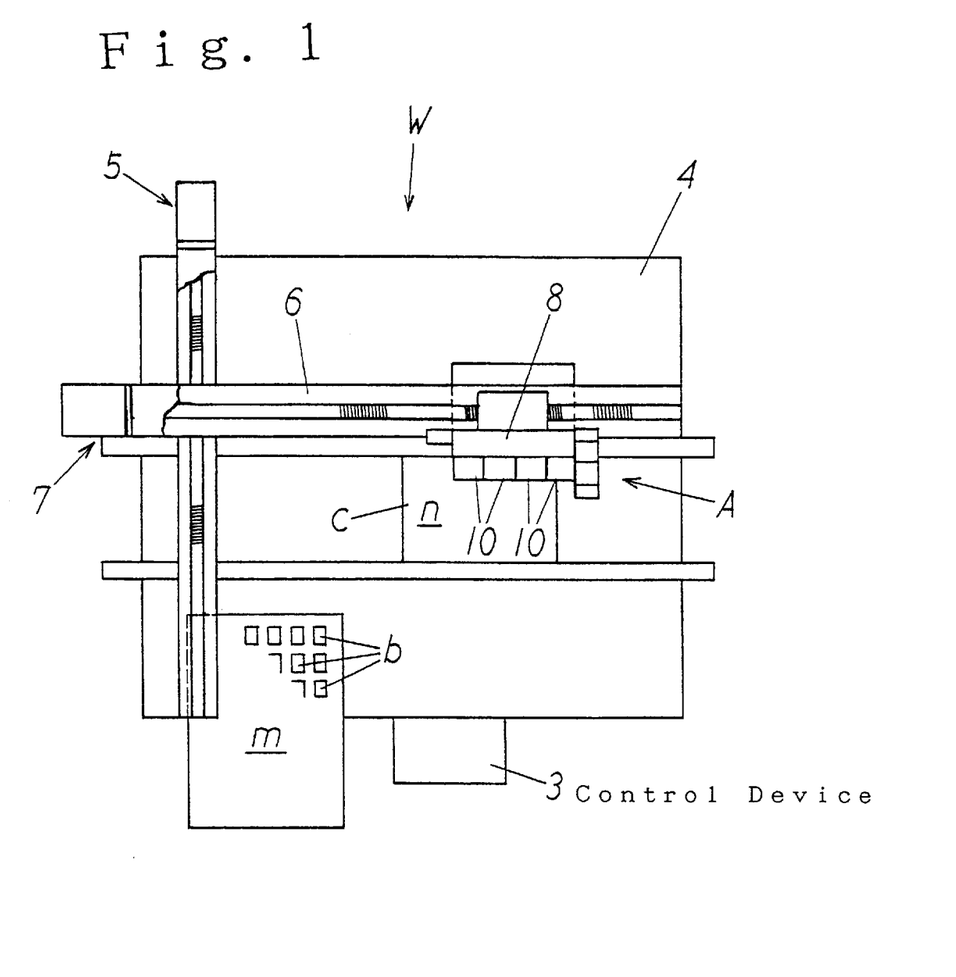
FIG. 1 is a schematic plan view of one embodiment of an adjustment device for an electronic part installation apparatus according to the invention, which uses a method of installing electronic parts of the invention.
Figure 2:
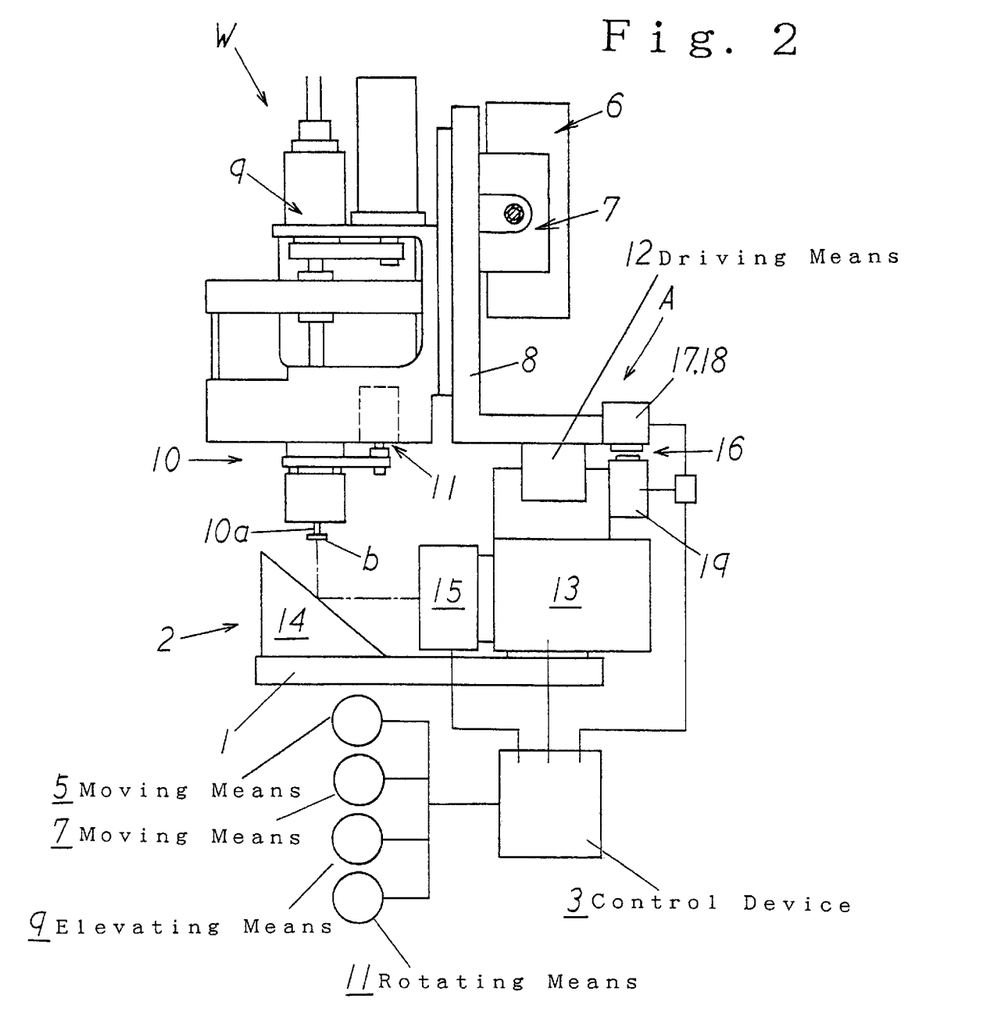
FIG. 2 is an enlarged side view for showing an installation head and a detection device shown in FIG. 1.

As shown in FIGS. 1 and 2, the apparatus W includes a moving member 6 connected to the machine body 4 to be movable in front and back directions as desired by moving means 5, and a movable member 8 connected to the moving member 6 to move in right and left or lateral directions as desired by moving means 7. Assembly heads 10 are attached to the movable member 8. Each assembly head 10 is moved up and down by elevating means 9, and rotated relative to a vertical axis by means of rotating means 11. The means 5, 7, 9 and 11 are formed of numerically controllable servo motors to be controlled precisely.

Figure 3:
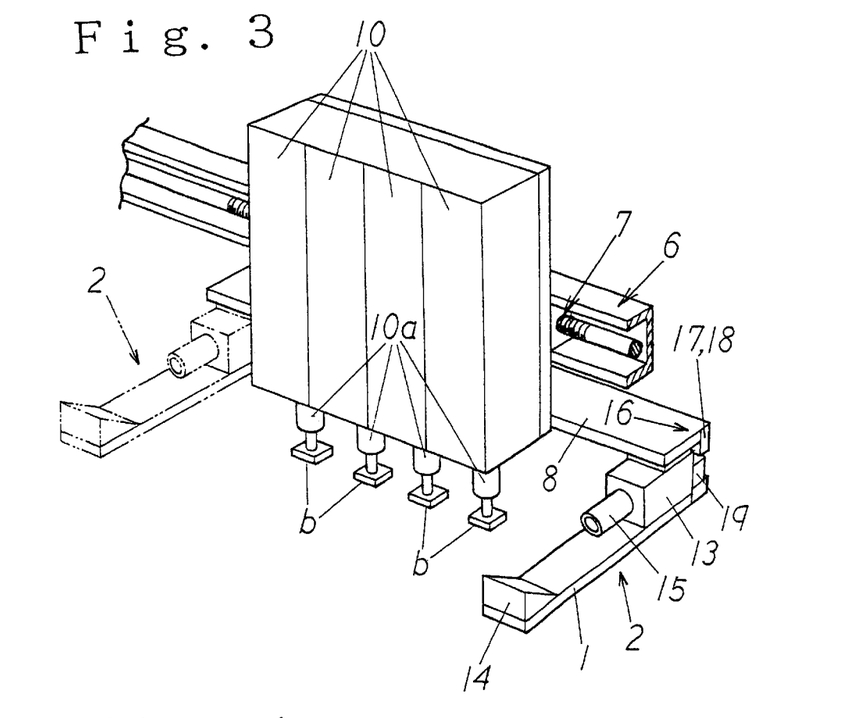
FIG. 3 is a perspective view of a main part shown in FIG. 2.

The assembly head 10 may be a sucking type wherein an upper surface of an electronic part b is sucked, or a chuck type wherein an outer periphery of an electronic part b is held by a chuck. The assembly head 10 may have a single head, but as shown in FIGS. 1 and 3, the assembly head 10 may have a plurality of heads or members to improve the assembly efficiency. In the present embodiment, the assembly head 10 is a sucking type and has a sucking member 10a at a bottom thereof.

Figure 4:
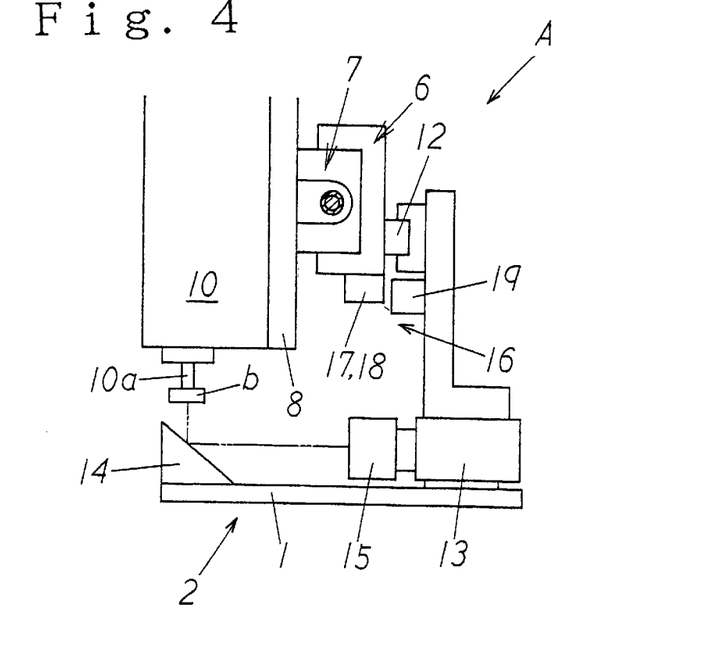
FIG. 4 is an enlarged side view of an installation head and a detection device for showing a different attaching example of the detection device shown in FIG. 1.
Figure 5:
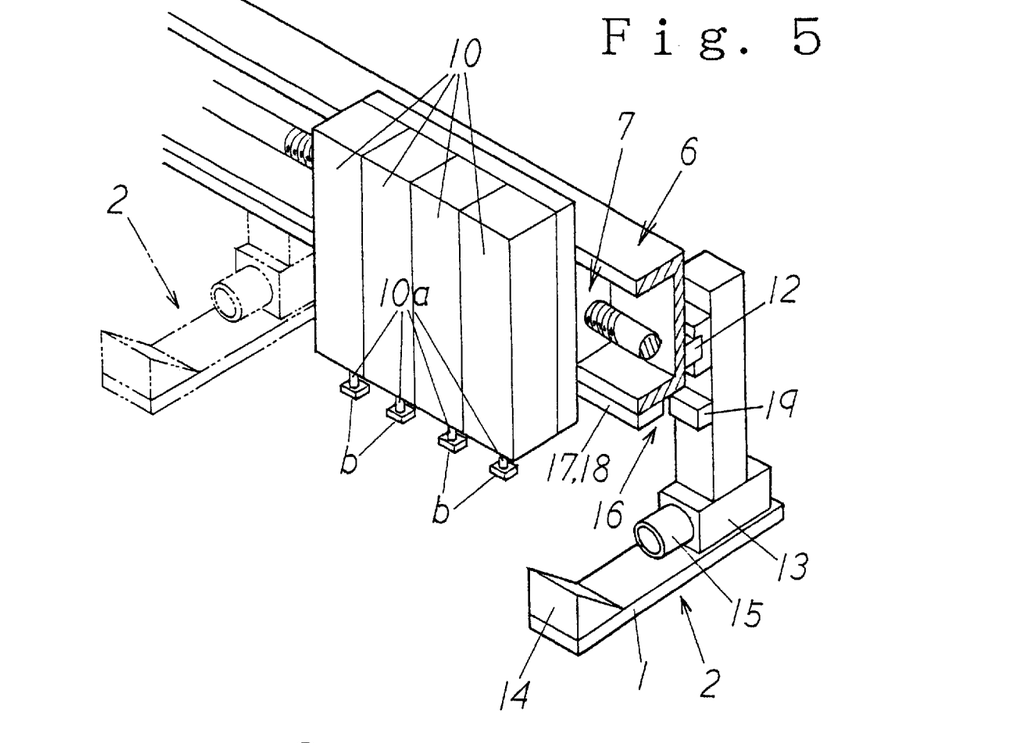
FIG. 5 is a perspective view of a main part shown in FIG. 4.
Figure 6:
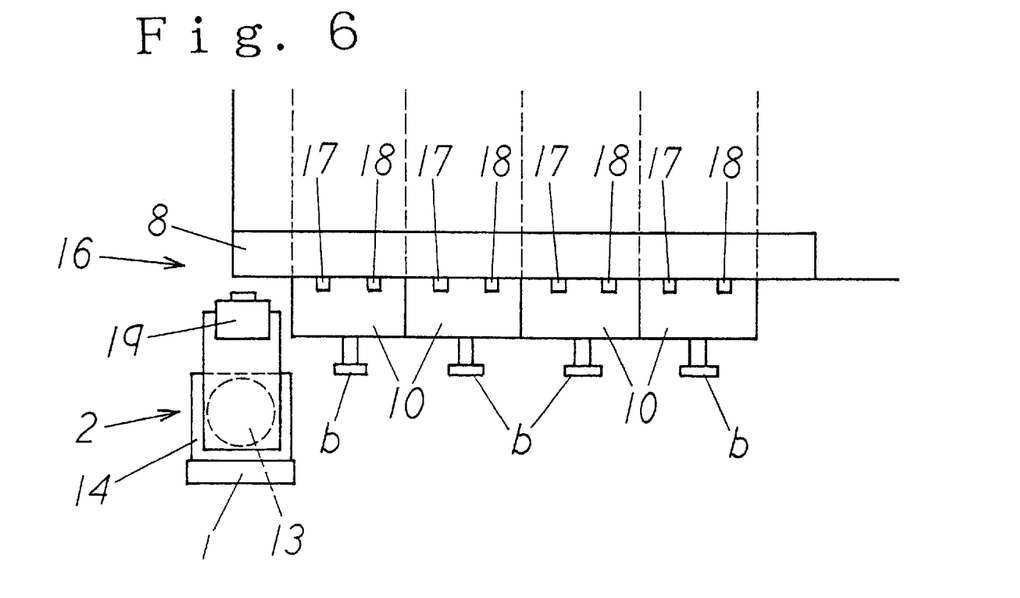
FIG. 6 is an explanatory view for showing a relation of a location detection member of the detection device shown in FIG. 1.

The attachment 1 is attached to the assembly head 10 generally horizontally at one side thereof. In a transfer system as shown in FIGS. 2 and 3, the attachment 1 with the detection device 2 is connected to the movable member 8. In a relative transfer system between the assembly head 10 and the detection device 2 as shown in FIGS. 4 and 5, the attachment 1 with the detection device 2 is attached to the moving member 6 by driving means 12 controlled by, for example a relatively controllable servo motor such that the detection device 2 moves back and forth under the assembly head 10.

The detection device 2 is fixed to the attachment 1, and detects a holding condition of the electronic part or parts b held by the assembly head 10 while it is being transferred from the supply section m. The detection device 2 is formed of a visual sensor 13, a light image incident means 14 and a light source 15.

The visual sensor 13 is attached to one side of the attachment 1 situated generally horizontally. Namely, the sensor 13 is located at one side relative to the electronic part b held by the assembly head 10. The visual sensor 13 may be a sensor conventionally used for CCD (charge coupled device) camera, wherein an image of the electronic part b is recognized or taken, and a detection signal thereof is transferred to the control device explained later in detail.

In the above image recognition, the whole size, position, e.g. from the front, back, right and left directions, lead pitch, bending shape of the leads, lead number and so on, of the electronic part held by the assembly head 10 are compared or checked in the control device with those memorized already in the control device. In other words, the electronic part b is checked if the part b is the proper part to be installed, if there is a damage, and if the position of the electronic part b relative to the assembly head 10 is proper. If the position is slightly different from that memorized already in the control device, the difference thereof is memorized, and when the electronic part b is actually installed on the print board c, the difference of the position is adjusted. Namely, the assembly head 10 is moved on the print board c to adjust the difference of the position. As a result of the adjustment of the position, the electronic part b is located in a proper position, i.e. the central portion of the electronic part b accords the central portion of the designated position on the print board C.

The light image incident means 14 is located on the attachment 1 at the other side relative to the visual sensor 13, and is disposed to move immediately under the electronic part b held by the assembly head 10. The light image incident means 14 may be a prism or mirror with a light reflection surface of 45°, which faces the visual sensor 13 and the surface of the electronic part b at 45°, respectively.

The light source 15 supplies or ejects light to the electronic part b of the assembly head 10 through the light image incident means 14, and the image is sent to the visual sensor 13 to thereby stabilize measurement by the visual sensor 13. The light source 15 is positioned coaxially with the visual sensor 13 in their optical axes and is located at a front side of the visual sensor 13.

The detection device 2 further includes a location detecting member 16 for controlling the light emitting position of the light source 15 and the light emitting time, which may be a phototube, proximity switch and so on. The location detecting member 16 may be attached to the moving member 6 or the movable member 8. Namely, in the type as shown in FIG. 2, the detecting member 16 is attached to the movable member 8 with the assembly head 10, and in the type as shown in FIG. 4, the detecting member 16 is attached to the moving member 6. The location detecting member 16 may be formed of detection elements 17, 18, and a detection member 19 fixed to the attachment 1 to cooperate with the detection elements 17, 18, so that the light illumination from the light source is started and stopped corresponding to the head 10 or sucking members 10a.

The control device 3 is associated with the detection device 2 and receives signals therefrom for calculation based on the predetermined data to thereby individually control the means 5, 7, 9, 11, driving means 12, and sucking means (not shown) for the head 10 or the sucking members 10a. A computer is used for the control device 3.

The operation of the apparatus is explained below.

The electronic parts b are to be installed at the predetermined positions on the print board c. In this operation, the procedures, order, parts moving values and so on are predetermined and memorized in the control device 3.

In order to assemble the electronic parts b, the movable member 8 having the assembly heads 10 and the sucking members 10a is moved to the supply section m for the electronic parts b by operating the moving means 5, 7. The sucking members 10a of the assembly heads 10 pick up the electronic parts b by using the elevating means 9 and, if necessary, together with the rotating means 11.

Then, the movable member 8 is moved to the assembly section n. When the detecting means 2 is moved laterally relative to the movable member 8 as shown in FIGS. 2 and 3, while the movable member is moving to the assembly section n, the driving means 12 for the detecting means 2 is operated. Namely, the attachment 1 with the detecting means 2 thereon is moved laterally relative to the assembly head 10.

When the detection member 19 of the location detecting member 16 passes to the detection member 17, i.e. light illumination start detection member, light is illuminated from the light source 15 to the electronic part b located at one end of the assembly head 10 through the light image incident means 14. The reflected light from the electronic part b is obtained as an image of the electronic part b by the visual sensor 13, which is transferred to the control device 3.

As the attachment 1 is moving, when the detection member 19 passes to the detection member 18, i.e. light illumination stopping member, light emitted from the light source 15 is stopped. The control device 3 calculates based on the above signals for the image and the data already inputted in the control device 3. Namely, the electronic part b is checked if it is the proper part to be installed, if there is a damage, and if the position of the electronic part b relative to the assembly head 10 is proper. In case the electronic part b is not proper, it is not installed on the print board.

If the position of the electronic part b held by the head 10 or the sucking member 10a is not appropriate, the measured position is compared with the ideal position inputted already in the control device 3 and the difference of the position is memorized in the control device 3. When the electronic part b is actually installed on the print board c, the position of the electronic part b relative to the print board c is adjusted based on the data of the difference of the position by, for example moving the movable member 8, the rotating means 11 and so on. Then, the electronic part b is installed on the print board c.

In case four sucking members 10a are used as shown in FIGS. 1 and 3, the similar procedures are taken for the rest of the sucking members 10a. If the positions of the electronic parts b relative to the respective sucking members 10a are different, these differences are memorized in the control device 3. When each electronic part b is actually installed in order on the print board c, each difference for the position is adjusted, and then, the electronic part b is placed on the print board c.

Figure 7:
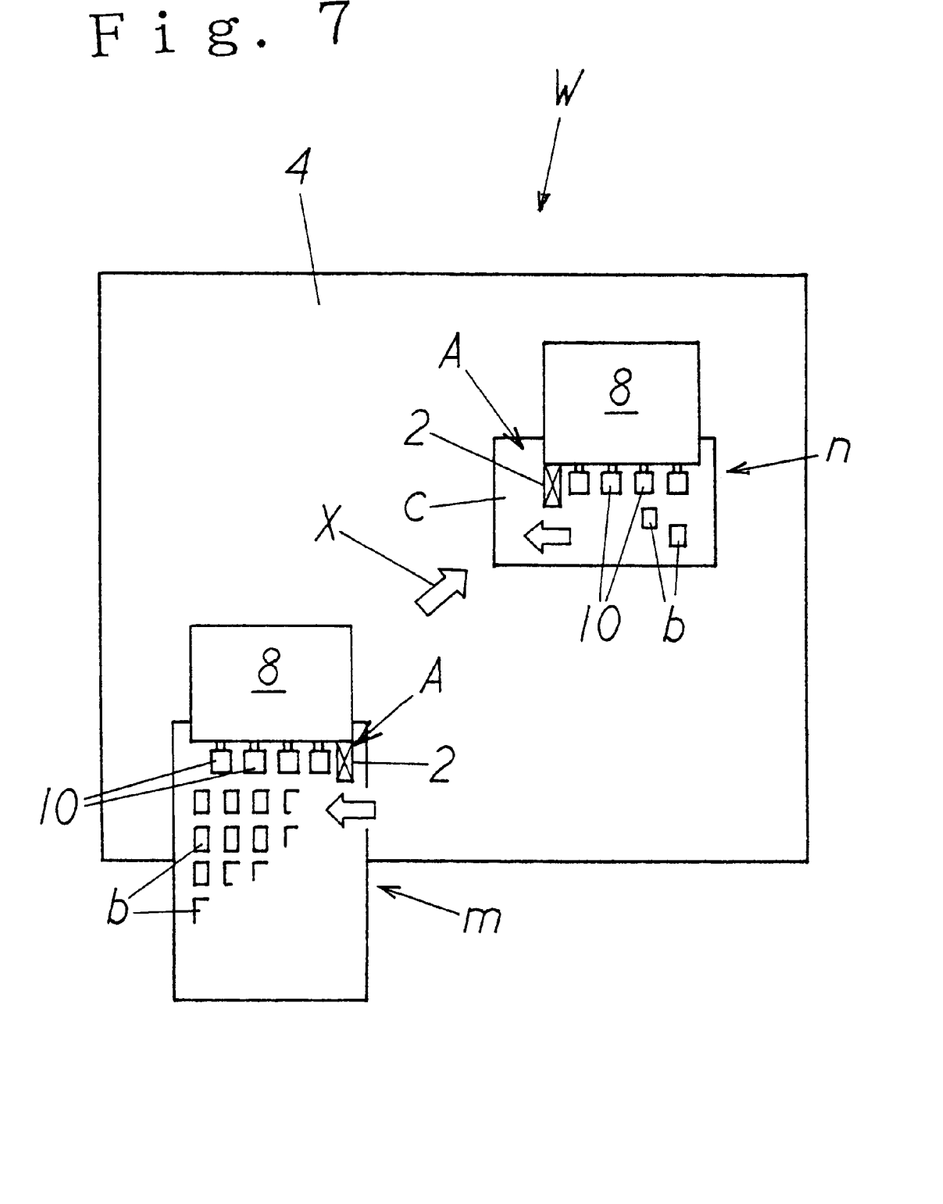
FIG. 7 is an explanatory view for showing an example of adjusting installation used in the apparatus shown in FIG. 1.

As shown in FIG. 7, the measurement by the detection device 2 is completed in a procedure X moving from a point that the sucking members 10a suck and hold the electronic parts b at the supply section m to a point that the assembly head 10 moves to the assembly section n. When the assembly head 10 moves to the assembly section n, the electronic parts b can be immediately mounted on the print board c one by one. Therefore, there is no waiting time.

In the embodiment as shown in FIGS. 4 and 5, the attachment 1 having the detection device 2 is connected to the moving member 6 through the moving means 12. Therefore, measurement of the electronic parts b held by the assembly head 10 can be made by simultaneously moving the movable member 8 with the assembly head 10 and the attachment 1 with the detecting device 2. Since the measurement of the electronic parts is made while the head 10 is moving from the supply section m to the assembly section n with the print board c thereon, working efficiency is more improved.

Figure 8A:
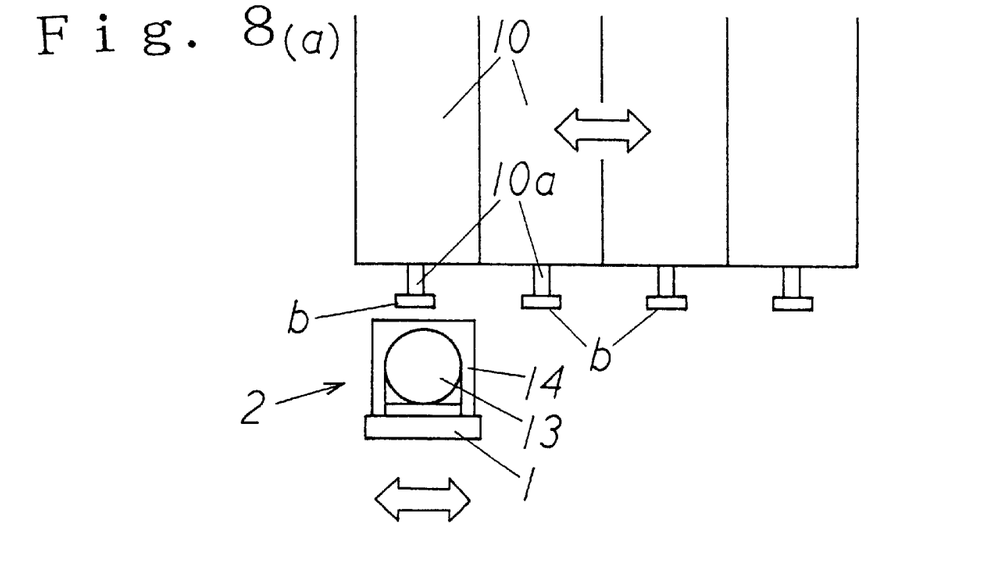
Figure 8B:
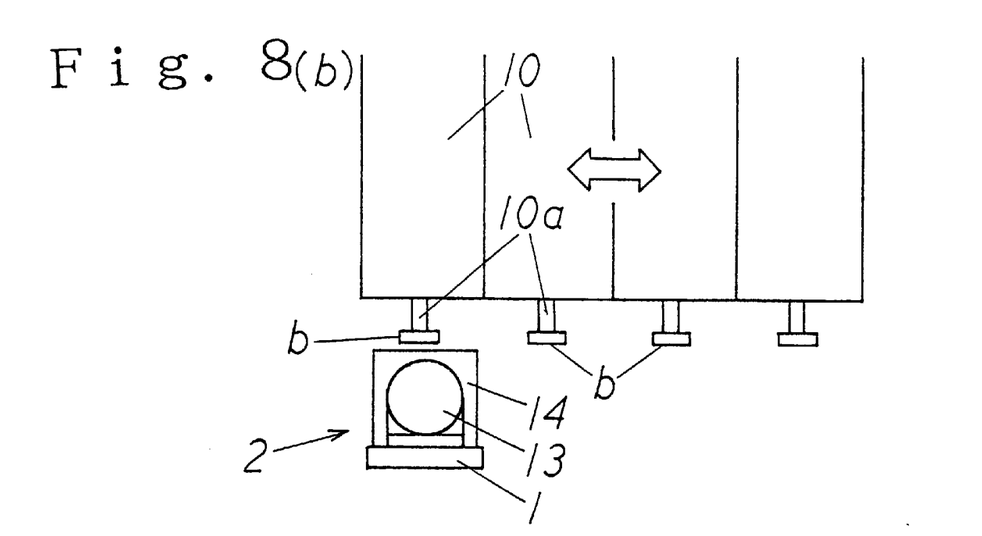

Further, in the same structure as stated above, as shown in FIG. 8(b), the detecting device 2 connected to the attachment 1 may be fixed, and the assembly head 10 may be moved above the detecting device 2. Therefore, it is possible to select a proper method to move the assembly head 10 to the assembly section n.

The measurement by the detection device 2 mounted on the attachment 1 may be made in both back and forth movements in case of four sucking members 10a as shown in FIG. 3. When the measurements for the electronic parts b are made in one way, the next measurements for the different electronic parts b can be made in a return movement immediately. Therefore, time for returning the detection device 2 can be saved.

In case the detection device 2 measures the parts b in one movement and no measurement is made on a return movement thereof, if the return movement of the detection device 2 is made while the assembly head 10 is moving back to the supply section m to take new electronic parts b, time for assembly can be greatly saved.

In the adjusting device for the electronic parts and the method of adjusting the position of the electronic parts of the invention, while the electronic parts are held in the assembly head and transferred to the assembly section, information for the electronic parts can be obtained. Therefore, efficiency for assembling the electronic parts onto the print board can be improved greatly, and a large number of assembly of the electronic parts can be made in a short period of time.

In the adjusting device of the invention, which can be made simple and compact, if the adjusting device includes a plurality of sucking members for the electronic parts, the sucking members do not bother assembly of the electronic parts when the head is moved for receiving and transferring the electronic parts.

While the invention has been explained with reference to the specific embodiments of the invention, the explanation is illustrative and the invention is limited to only by the appended claims.

What is claimed is:

1. An adjustment device for an electronic part installation apparatus, said installation apparatus having a head portion for holding an electronic part and moving means for moving the head portion from a supply section to an assembly section, said adjustment device comprising:

a base member attached to one of the head portion and the moving means, said base member being movable to completely pass under the head portion, detecting means for detecting the electronic part held by the head portion, said detecting means being fixed to the base member and passing completely under the electronic part while the electronic part is moving from the supply section to the assembly section, said detecting means including one light reflecting device situated on one side of the base member and passing under the electronic part when the base member moves under the head portion, a visual sensor situated on the other side of the base member to receive an image of the electronic part and a part of the head portion through the light reflecting device, a light source situated on the base member coaxially between the light reflecting device and the visual sensor, and a switch electrically connected to the light source and the visual sensor for actuating the light source and the visual sensor when the light reflecting device passes under the head portion, said light source illuminating the electronic part through the light reflecting device when the switch is actuated so that the visual sensor recognizes clearly the electronic part and a position of the electronic part relative to the head portion, and control means electrically connected to the detecting means and having a memory to which ideal data for the electronic part and the position of the electronic part relative to the head portion are inputted in advance, said control means comparing the ideal data inputted in advance to the memory and data received from the detecting means and controlling the moving means to properly install the electronic part at the assembly section.

2. An adjustment device according to claim 1, wherein said head portion includes a plurality of attaching members and rotating members fixed to the respective attaching members for changing positions of the respective attaching members, each attaching member holding one electronic part to thereby carry a plurality of electronic parts at one movement of the head portion, said memory of the detecting means receiving ideal data for each electronic part so that when each electronic part is discharged at the assembly section, moving means is moved to a proper position with reference to the ideal data for each electronic part.

3. An adjustment device according to claim 2, wherein said moving means includes a first moving member, and a second moving member connected to the first moving member to be moved along the first moving member, said head portion being attached to the second moving member to be moved along the second moving member.

4. An adjustment device according to claim 3, wherein said base member is movably attached to the second moving member, said base member being moved under the head portion when the detection means is actuated.

5. An adjustment device according to claim 3, wherein said base member is movably attached to the head portion.

6. An adjustment device according to claim 2, wherein said plurality of attaching members is situated adjacent to each other so that when the base member is moved under the attaching members, the electronic parts held by the attaching members are recognized by the visual sensor at once.

7. An adjustment device according to claim 1, wherein said base member is slidably attached to the head portion and is moved from one side to the other side of the head portion so that the detecting means is not located immediately under the head portion at the supply section and the assembly section.

8. A method of checking electronic parts in assembling the electronic parts, comprising:

picking up electronic parts at a supply section by a head portion and moving the head portion with the electronic parts to an assembly section by moving means, said head portion having a plurality of attaching members situated adjacent to each other, each attaching member picking up one electronic part, moving detecting means under the electronic parts held by the head portion while the electronic parts are moving from the supply section to the assembly section, to thereby recognize the electronic parts and positions of the electronic parts relative to the head portion, said detecting means being moved from one side to the other side of the head portion so that the detecting means is not located immediately under the head portion at the supply section and the assembly section, said detecting means recognizing the electronic parts held by the attaching members when the detecting means is moved from said one side to the other side under the attaching members, comparing data received from the detecting means and ideal data memorized in a memory in advance, said ideal data including the electronic parts and the positions of the electronic parts relative to the head portion, and calculating difference between the data from the detecting means and the ideal data in the memory, and controlling the moving means based on the difference of the data to properly locate the electronic parts at the assembly section.

9. A method according to claim 8, wherein said electronic parts and the positions are recognized by obtaining an image of the electronic parts and the head through a camera.

10. A method according to claim 9, wherein said detecting means is attached to the head portion and is moved relative to the head portion.

11. A method according to claim 9, wherein said detecting means is attached to the moving means and is moved on the moving means relative to the head portion.

* * * * *